(12) United States Patent
Fink et al.

(10) Patent No.: US 11,496,059 B2
(45) Date of Patent: Nov. 8, 2022

(54) VARIABLE VOLTAGE GENERATOR CIRCUIT, CAPACITOR AND METHOD

(71) Applicant: COMET AG, Flamatt (CH)

(72) Inventors: Thomas Fink, Staufen (CH); Ralf Negele, St. Gallen (CH)

(73) Assignee: COMET AG, Flamatt (CH)

( * ) Notice: Subject to any disclaimer, the term of this patent is extended or adjusted under 35 U.S.C. 154(b) by 177 days.

(21) Appl. No.: 16/465,415

(22) PCT Filed: Nov. 29, 2017

(86) PCT No.: PCT/EP2017/080888
§ 371 (c)(1),
(2) Date: May 30, 2019

(87) PCT Pub. No.: WO2018/100014
PCT Pub. Date: Jun. 7, 2018

(65) Prior Publication Data
US 2020/0007047 A1   Jan. 2, 2020

(30) Foreign Application Priority Data

Nov. 30, 2016 (EP) ..................... 16201548

(51) Int. Cl.
*H02M 1/42* (2007.01)
*H02M 3/335* (2006.01)
*H02M 1/00* (2006.01)

(52) U.S. Cl.
CPC ..... *H02M 3/33584* (2013.01); *H02M 1/4225* (2013.01); *H02M 1/007* (2021.05)

(58) Field of Classification Search
CPC ......... H02M 3/158; H02M 2001/0064; H02M 2003/1552; H02M 3/155–1588
USPC ......................................... 363/15
See application file for complete search history.

(56) References Cited

U.S. PATENT DOCUMENTS 6,740,842 B2   5/2004 Johnson et al.
9,419,551 B2 *  8/2016 Pietromonaco ........ H02K 11/22
(Continued)

FOREIGN PATENT DOCUMENTS

DE   102014016076 A1   8/2015
JP      2000278962 A   10/2000
(Continued)

OTHER PUBLICATIONS

Authors et al., "A DC Power Supply for High Power RF Pulsing Applications", IP.com, 2015, 13 pages, West Henrietta, New York.
(Continued)

*Primary Examiner* — Peter M Novak
(74) *Attorney, Agent, or Firm* — The Webb Law Firm

(57) ABSTRACT

A variable voltage generator circuit is described for generating, from a substantially constant supply voltage $V_S$, a variable high-voltage control voltage $V_C$ for a variable power capacitor (1) having a variable-permittivity dielectric. The control voltage generator circuit comprises a top-up circuit (10) for maintaining the voltage $V_{Cin}$ on an input capacitor (12) at least at supply voltage $V_S$, and a bidirectional DC-DC converter circuit (20) having a variable voltage conversion factor G controlled by control input signal (27). The bidirectional DC-DC converter (20) is arranged to convert voltage, at the voltage conversion factor G, between the input capacitor voltage $V_{Cin}$ and the output voltage $V_C$. When $V_C < G \times V_{Cin}$, the DC-DC converter circuit (20) uses charge stored in the input capacitor (12) to charge the capacitive load (1). When $V_C > G \times V_{Cin}$, the DC-DC converter circuit (20) uses charge stored in the load capacitance (1) to charge the input capacitor (12).

14 Claims, 4 Drawing Sheets

(56) References Cited

U.S. PATENT DOCUMENTS

| | | | |
|---|---|---|---|
| 9,509,145 B2 * | 11/2016 | Kanao | H02J 3/1814 |
| 9,627,961 B1 * | 4/2017 | Wu | H02M 7/537 |
| 2002/0125207 A1 | 9/2002 | Ono et al. | |
| 2009/0257167 A1 * | 10/2009 | Kanno | H01G 7/06 |
| | | | 361/278 |
| 2011/0090717 A1 | 4/2011 | Lee et al. | |
| 2013/0039104 A1 | 2/2013 | Sharma | |
| 2013/0106342 A1 | 5/2013 | Iwata et al. | |
| 2015/0048718 A1 | 2/2015 | Etzler et al. | |
| 2015/0174693 A1 | 6/2015 | Astle et al. | |
| 2016/0016479 A1 * | 1/2016 | Khaligh | H01F 38/08 |
| | | | 336/170 |
| 2016/0294290 A1 | 10/2016 | Tamura et al. | |

FOREIGN PATENT DOCUMENTS

| | | |
|---|---|---|
| KR | 101031217 B1 | 4/2011 |
| WO | 0105020 A1 | 1/2001 |

OTHER PUBLICATIONS

Huang et al., "Analytical Switching Cycle Modeling of Bidirectional High Voltage Flyback Converter for Capacitive Load Considering Core Loss Effect", IEEE Transactions on Power Electronics, 2015, pp. 470-487, vol. 31, No. 1.

Wang et al., "Design Considerations for a Level-2 On-Board PEV Charger Based on Interleaved Boost PFC and LLC Resonant Converters", IEEE Transportation Electrification Conference and Expo (ITEC), 2013, 8 pages.

* cited by examiner

VARIABLE VOLTAGE GENERATOR CIRCUIT, CAPACITOR AND METHOD

FIELD OF THE INVENTION

The invention relates to the field of high-voltage, fast variable DC voltage sources. In particular, but not exclusively, it relates to the field of providing fast dynamic high-voltage DC control voltages to devices which present a capacitive load, but which consume little or no energy.

BACKGROUND OF THE INVENTION

International application WO2016034241A1 describes a very fast variable power capacitor which can be used to provide a highly dynamic RF power supply, such as may be required for plasma chambers used for plasma etching or deposition, for example. The variable power capacitor has a paraelectric dielectric material with a variable permittivity which may be varied by applying a large electric field or a large DC voltage across the dielectric material. Control electrodes are provided for this purpose. By varying the voltage on the control electrodes, it is possible to change the capacitance of the variable capacitor very fast and accurately. This in turn permits a highly responsive impedance matching of the radio-frequency (RF) power supply to a plasma processing chamber, which in turn improves control and feature resolution of the plasma process (eg etching or deposition process).

It has been determined that, in realising the benefits of the fast variable power capacitor, the applied DC voltage should advantageously be capable of being varied between a high voltage (for example more than 1 kV, more than 3 kV, or more than 5 kV) and a low voltage (eg 0V) very quickly (eg within 10 ms, or 1 ms or 100 µs, or 10 µs or less), ie at a high rate of as much as $10^5$ V/s or more, or $10^6$ V/s or more, or $10^7$ V/s or more, or $10^8$ V/s or more. The control electrodes, and the dielectric between them, form a load capacitance for the applied DC voltage, so the control voltage source should preferably be capable of charging or discharging the load capacitance through the full voltage range (eg from 0V to 5 kV or vice versa) in this short time.

Similarly, piezo-actuators can be used in applications such as high-speed switching. Accelerations of 10000 g or more can be achieved if the applied driver voltage can be varied quickly enough. To this end, the driver voltage may need to be varied through a large voltage range (eg 1 kV or more) in a very short time (eg 1 ms or less, or 0.1 ms or less, or 0.01 ms or less).

The capacitance of a capacitive load such as that presented by a piezo actuator or by the dielectric between the control electrodes of the variable power capacitor mentioned above may be of the order of 10 pF to 100 nF, or more than 100 nF, for example. It is a non-trivial task to charge and discharge such a capacitive load with large voltage ranges when the charge/discharge time is very short. The problem is further compounded by any lossy elements in the control voltage generator circuitry. In applications such as the fast variable capacitor for plasma generation or the piezo actuators described above, it is advantageous to be able to vary the output voltage not only very rapidly, but also with a high precision.

The need has thus been identified for a fast variable high-voltage source which can generate a rapidly changing output voltage from a substantially steady input voltage, but without compromising accuracy and efficiency.

PRIOR ART

A two-stage power converter is known from US20110090717, in which an unregulated LLC converter is controlled by pulse-width modulating a bidirectional boost converter to adjust an input voltage of the LLC converter using feedback from the output voltage of the LLC converter, such that the output is maintained at a constant voltage such as 400V from an input voltage of 140V. The circuit is designed to provide smooth power with constant input and output voltages and with an energy transfer between the input and output which is as efficient as possible, because the circuit is required to work for example at 2500 W. The circuit described in US20110090717 is a large and robust circuit comprising components dimensioned to sustain operation at the specified high working power ratings, and the circuit would not be suitable for generating rapidly and precisely variable output voltages from 0V to eg 5 kV or higher, with negligible net power consumption (ie with very high power efficiency), as specified for the applications described above. In particular, the circuit of US20110090717 would not be capable of generating an output voltage range which included very low voltages, approaching 0V.

There is thus a need for a DC voltage supply which can provide accurately-controllable, high-voltage, fast-varying DC voltages in a low-loss circuit which can be implemented in a small physical size and which can supply an output voltage which ranges from a very high to a very low voltage.

BRIEF DESCRIPTION OF THE INVENTION

The present invention aims to overcome at least some of the above disadvantages of prior art variable control voltage generation circuits. To this end, a variable voltage generator circuit according to the invention is described, a variable capacitor according to the invention is described, and a method according to the invention is described. Variants of the circuit and method of the invention are described.

A bidirectional DC-DC converter is used to vary the output voltage by varying its voltage amplification factor while keeping the input voltage more or less steady. An input capacitor provides a reservoir of charge which can be used to charge the capacitive load when the control input signal determines that the output voltage is to be increased, and the load capacitance is discharged back to the input capacitor when the output voltage is to be decreased. The charge is thus transferred back and forth to charge and discharge the load capacitance as required by the particular application (eg the dielectric between the control electrodes of a variable power capacitor used for supplying power to a plasma chamber). The circuit thus has low overall losses, because most of the electrical energy is recovered whenever the output voltage is to be decreased. This means that the circuit can be implemented with relatively small components, and it means that the control input signal can be used to accurately and rapidly set the value for generating the desired instantaneous output voltage. Furthermore, the amplified output voltage follows the control input signal without the need for any further control inputs, such as feedback from the output voltage. By allowing current flow through the circuit to change magnitude and direction very quickly under the control of the steering signal (which may be a pulse width modulation signal applied to the switching control of the bidirectional buck converter), the circuit allows charge to move between the upstream input capacitance and the downstream load capacitance, with low losses, such that the overall power consumption of the voltage supply circuit is substantially limited to only the losses. Although the instantaneous power transfer in the circuit may sometimes be large, particularly during large, fast output voltage swings, the large current values are transient and the circuit components need only be dimensioned for very modest overall power transfer. Because the variable capacitor (or the piezo actuator) draws very little (eg substantially zero) net power, the overall net power transfer through the voltage supply circuit is very low, ie substantially zero. The components of the input circuit, also referred to as the top-up circuit, need only be dimensioned to supply enough power for this net power requirement, and to compensate for losses incurred as the current flows back and forth between the upstream and downstream capacitances.

DETAILED DESCRIPTION OF THE INVENTION

The invention will now be described in detail with reference to the attached drawings, in which.

It should be noted that the figures are provided merely as an aid to understanding the principles underlying the invention, and should not be taken as limiting the scope of protection sought. Where the same reference numbers are used in different figures, these are intended to indicate similar or equivalent features. It should not be assumed, however, that the use of different reference numbers is intended to indicate any particular degree of difference between the features to which they refer.

Figure 1:
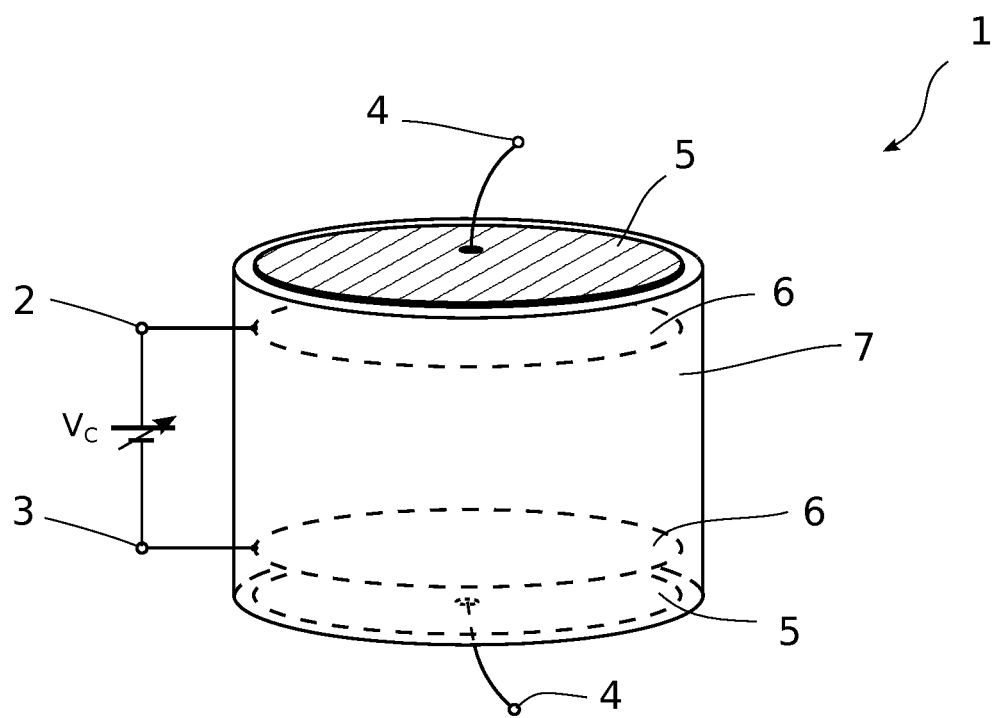
FIG. 1 shows a schematic representation of a variable capacitor with control voltage applied to a paraelectric dielectric.

A variable capacitor 1 such as that known from WO2016034241A1 is illustrated schematically in FIG. 1. The example capacitor 1 comprises a block or plate of paraelectric dielectric material 7 and two main capacitor electrodes 5 and capacitor leads 4. The capacitance of the device can be varied by applying an electric field across the dielectric 7. This can be achieved by connecting a variable voltage source $V_C$ to control electrodes 6 at connection terminals 2 and 3. Varying the control voltage $V_C$ causes the permittivity of the part of the dielectric 7 between the control electrodes 6 to vary, thus altering the capacitance of the capacitor 1 between the capacitor electrodes 5.

It is a significant advantage of this kind of variable capacitor that the capacitance can be varied very rapidly. This makes the capacitor useful for applications such as plasma generation, in which highly responsive impedance matching is required which can be achieved by fast adjustment of such kinds of variable capacitors by changing the applied high voltage. In order to realise the benefits of the high voltage, high speed variable capacitor, a suitable control voltage generator circuit is required, which is capable of providing the large voltage range, varying from low or zero voltage to high voltage (eg 1 kV, 3 kV, 5 kV, or up to 6 kV or more), and the high speed required.

FIGS. 2 to 6 show, in various levels of detail, schematic views of an example voltage supply circuit according to the invention, designed to fulfill the requirements described above for supplying a rapidly-variable high voltage for the control electrodes of the variable capacitor described.

Figure 2:
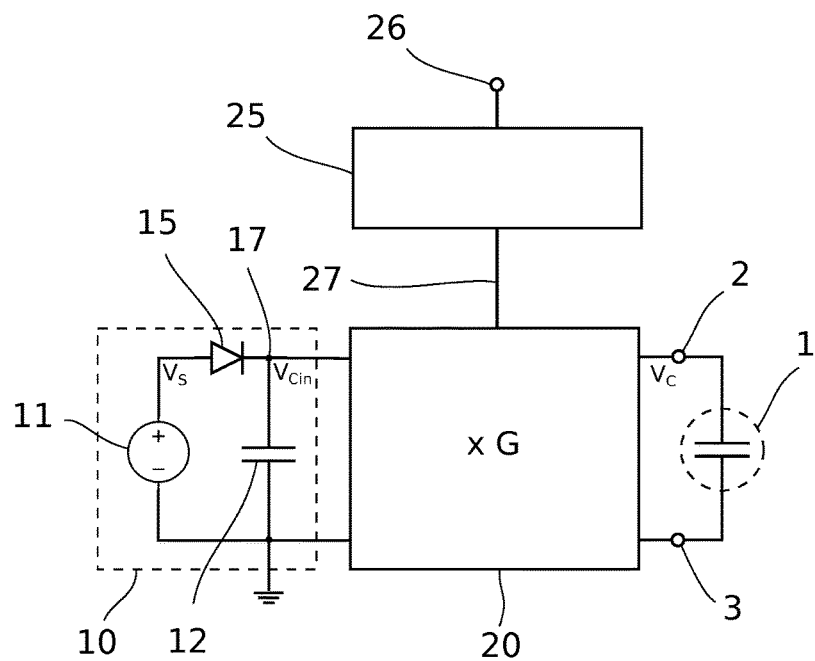
FIG. 2 shows in schematic overview a control voltage generator circuit for the control electrodes of the capacitor of FIG. 1, according the invention.

Referring to FIG. 2, an input capacitor 12 on the upstream (left) side of the circuit is maintained charged at supply voltage $V_{Cin}$ (voltage at circuit node 17) by DC voltage source 11 at $V_S$ via diode 15. The circuit 10 is designed to charge the input capacitor 12 to voltage $V_S$ when the voltage $V_{Cin}$ on the capacitor falls below $V_S$. This "top-up" charging of the input capacitor 12 replenishes electrical energy which is lost due to losses which arise when charge is moved back and forth by the bidirectional DC-DC converter circuit 20 between the input capacitor and the load capacitance 1. In operation, $V_{Cin}$ is normally equal to or a little higher than $V_S$, depending on the circuit components and the application requirements. In particular, $V_{Cin}$ will be greater than $V_S$ when the input capacitor is already at $V_S$ and is to be charged using charge from the load capacitance 1. The input capacitor 12 is advantageously selected to have a capacitance much greater than that of the load capacitance 1, so that even a sudden large decrease in $V_C$ will only require a modest increase of $V_{Cin}$ above $V_S$ in order to charge the input capacitor 12 with the charge returning from the load capacitance. The input capacitance 12 may preferably have a capacitance value of at least 50 times, or more preferably at least 100 times, or more preferably 200 times, or more preferably 500 times the capacitance value of the load capacitance 1, for example. The load capacitance is substantially purely capacitive (it may have a reactance which is at least 100 times as great as its resistance, for example).

The bidirectional DC-DC converter circuit 20 has a variable voltage amplification factor G which is controlled by control input signal 27 from control unit 25. In the following text, the term voltage conversion factor is taken to refer to the instantaneous voltage amplification provided by the DC-DC converter 20 in the forward (ie upstream-to-downstream, left-to-right, input-to-output) direction. The voltage conversion factor in the reverse direction is similar to the forward conversion factor, but in the inverse (reciprocal) sense.

Control unit 25 may be required to translate a control input 26, which may indicate an instantaneous requirement of the application (eg a plasma chamber), into a control input signal 27 for setting the appropriate value of G for outputting the required output voltage $V_C$. The control unit 25 may include some detailed application data (for example stored as algorithms or in fast look-up-table form) for mapping an instruction 26 into a suitable value of G for carrying out the instruction 26. As an example in the application of a fast variable power capacitor used in an impedance matching network (matchbox) of an RF power supply for a plasma chamber, the matchbox may call for the capacitor 1 to change capacitance suddenly from a first given value to a second, quite different value. In order to effect this change, a particular change in voltage $V_C$ applied to the control electrodes of the variable power capacitor 1 is required. In this example, the control unit may be provided with data for calculating or otherwise determining what new value of $V_C$ is required in order to effect the new capacitance of the variable capacitor 1, and what value of G is required in order to change the output voltage $V_C$ to this new value. The required value of G is then encoded into control input signal 27 and used to change the voltage conversion factor of the DC-DC converter, whereupon a flow of charge takes place between input capacitor 12 and load capacitance 1, depending on whether the output voltage $V_C$ is to be increased or decreased.

Note that, in the example of an application of the inventive circuit to control a variable power capacitor 1, the capacitance between the control electrodes 6 may be the same as, or different from the capacitance between the principal electrodes 5, depending on the construction of the capacitor.

Figure 3:
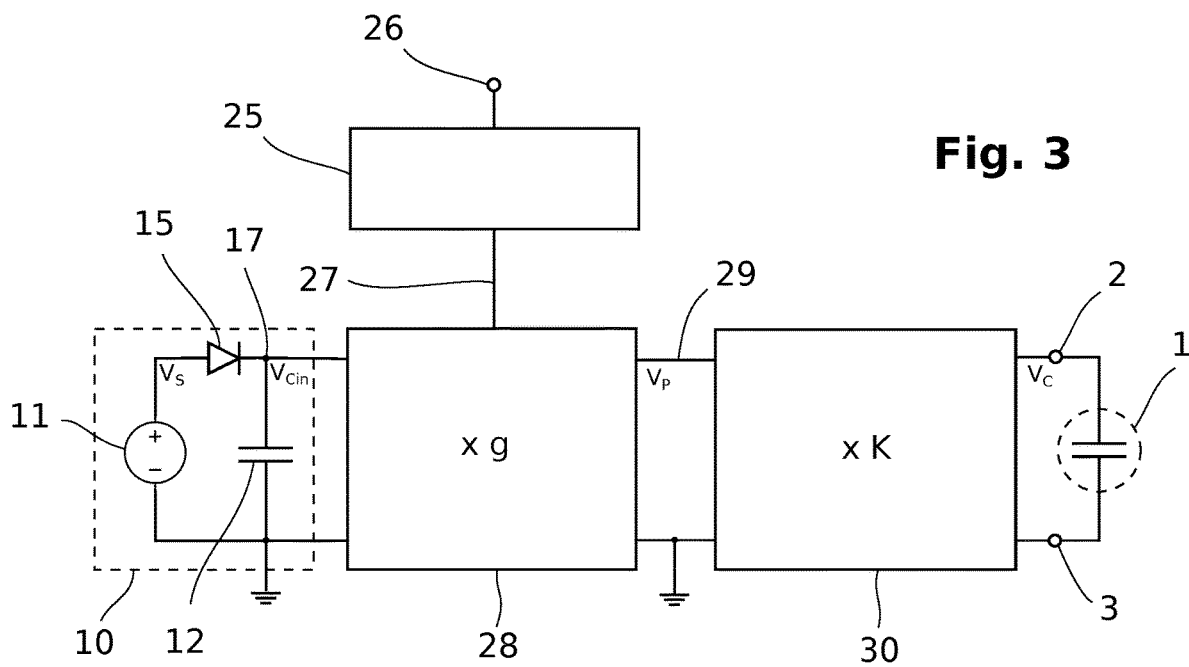
FIG. 3 shows a variant of the example circuit of FIG. 2.

FIG. 3 shows an example variant of the circuit of FIG. 2. In this variant, the variable bidirectional DC-DC converter 20 is implemented as two converter stages 28 and 30, both of which are bidirectional, and which together perform the same function as the DC-DC converter circuit 20 of FIG. 2. Variable bidirectional DC-DC circuit 28 generates a variable steering voltage with a conversion factor g determined by the control input signal 27. Constant bidirectional DC-DC converter circuit 30 has a constant voltage conversion factor K, where g×K is equivalent to the factor G of the circuit of FIG. 2. As will be seen in the detailed example description below, there are practical advantages to separating the functions of the variable gain stage (28) and the main amplification stage (30).

Figure 4:
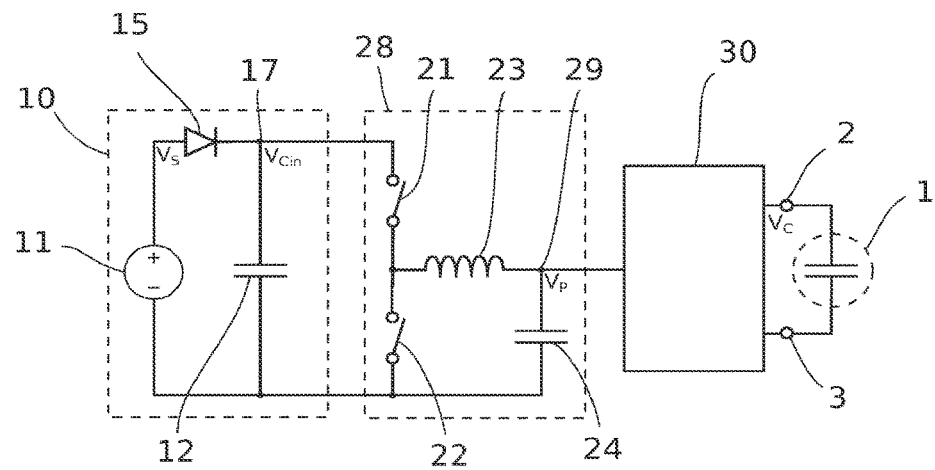
FIG. 4 shows an example implementation of the control voltage generator circuit of FIG. 3, according the invention.
Figure 5:
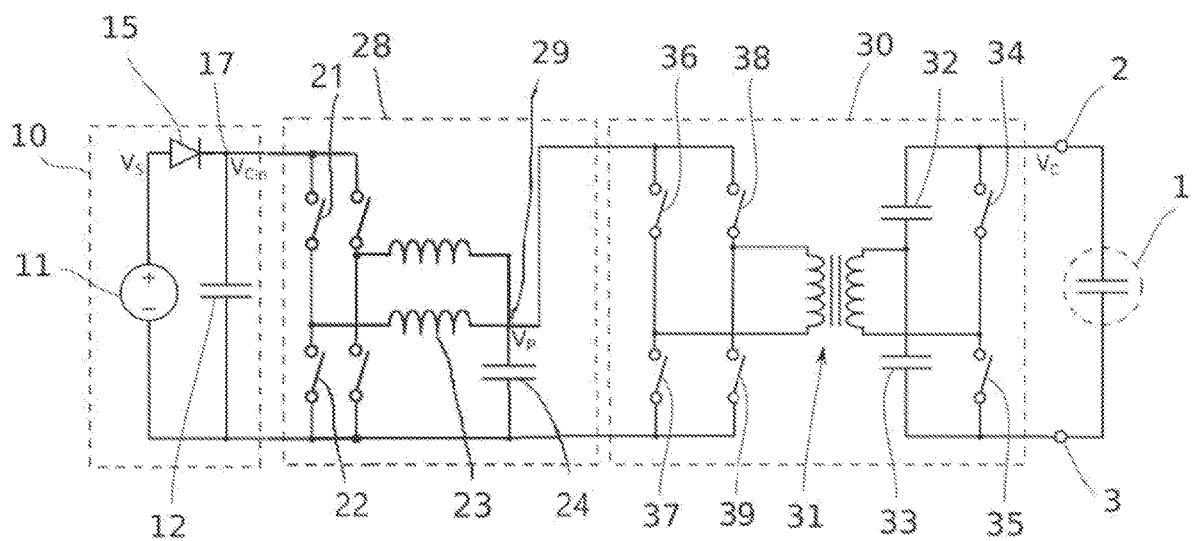
FIG. 5 shows more detail of an example implementation of the control voltage generator circuit of FIG. 4, in particular interleaved bidirectional buck converters.
Figure 6:
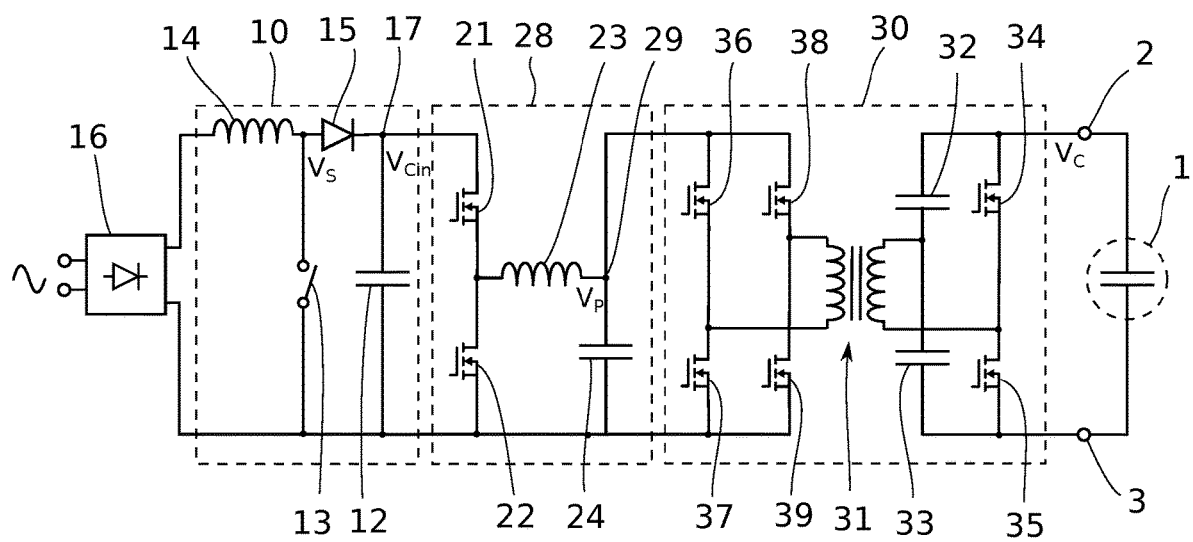
FIG. 6 shows more detail of the example implementation of FIG. 5.

The control unit 25 is not shown in FIGS. 4 to 6, but is assumed to be present in order to actuate at least some of the switches or switchable components in the detailed circuits of FIGS. 4 to 6. The control unit controls the switching components of the bidirectional buck converter 28, for example. The switching of the LLC converter preferably does not require any variable or programmed control, since it preferably operates with a substantially constant switching regime.

FIG. 4 shows an example implementation of the circuit of FIG. 3. In this example, a bidirectional buck converter 28 comprising switching elements 21, 22, an inductor 23 and capacitor 24 serves to generate a steering voltage $V_P$ at circuit node 29. Steering voltage $V_P$ is set by varying a switching duty cycle of the switching elements 21 and 22 under control of the control input signal (not shown). The instantaneous value of $V_P$ may be thought of as being proportional to $V_{Cin}$ multiplied by the "on" fraction of the duty cycle of the upper switching means 21. The bidirectional buck converter is used here in the sense that it acts as a buck converter in the forward direction (reducing the voltage $V_{Cin}$ to $V_P$) and as a boost converter in the reverse direction (amplifying the voltage $V_P$ to $V_{Cin}$). If required for the particular application, the steering voltage $V_P$ can be varied from a low or substantially zero value to a high value, substantially $V_{Cin}$. The minimum of $V_P$, $V_P(\min)$, is preferably less than 25% of $V_{Cin}$, or more preferably less than 10% of $V_{Cin}$. The maximum of $V_P$, $V_P(\max)$, is preferably greater than 75% of $V_{Cin}$, or more preferably greater than 90% of $V_{Cin}$.

The variable capacitor 1 described above, for example, would typically have its greatest capacitance value when the control voltage $V_C$ is zero. In this case, it is advantageous to be able to reduce $V_P$, and thereby $V_C$, to 0V in order to maximise the available capacitance value of the variable capacitor 1. A single bidirectional buck converter circuit 28 is shown in FIGS. 4 and 6. However, two or more such circuits could be connected in parallel in order to distribute power over multiple interleaved slices and in order to reduce an amount of ripple or fluctuation in the value of $V_P$ as shown in FIG. 5. The values of the inductor 23 and the capacitor 24 are preferably small, in order to permit fast operation (eg 150 kHz or more), so the capacitor 24 does not provide a significant smoothing function. In addition, in the example applications (eg variable capacitor 1), the constant DC-DC converter (represented as block 30 in FIGS. 3 to 6) may have a voltage amplification factor of 10 or more, in which case a ripple in $V_P$ may be magnified tenfold in $V_C$. Interleaving multiple bidirectional buck converter circuit slices can help to mitigate such ripple in the output $V_C$.

The bidirectional DC-DC converter 30 may be implemented as a bidirectional synchronous resonant LLC converter as shown in FIGS. 5 and 6, having a substantially constant switching regime and predetermined voltage amplification characteristics, operating in a synchronous, soft-switched mode at or near the converter's resonant frequency. The amplification characteristics may be substantially linear or non-linear, but the transfer function should preferably be stable and predictable. The downstream voltage $V_C$ of the DC-DC converter 30 need not be used as a control parameter for controlling the bidirectional buck converter 28, as will be explained below.

The control voltage generator circuit shown in FIGS. 4 to 6 is controlled by one or more control units (not shown), which may be implemented in hardware and/or software. Apart from a control unit providing a switching signal for the bidirectional DC-DC converter 30, a control unit provides a pulse-width modulation (PWM) control signal to the bidirectional buck converter circuit 28. The control unit for providing the control signal may calculate the PWM duty ratio based on parameters of the particular application for which the control voltage generator circuit is used. In the case of the variable capacitor 1 described above used in a dynamic impedance matching apparatus, for example, a control unit of the impedance matching apparatus may issue a capacitance value parameter instruction for the capacitor 1. Using previously-obtained performance information of the capacitor 1 and control voltage circuit elements 28 and 30, the control signal can be calculated which will result in the required capacitance value of the capacitor 1, taking into account different operating conditions (eg temperature). In the case of a piezo actuator, a similar control path can be implemented in that the control signal can be calculated based on previously-obtained performance information mapping PWM duty cycle values to the resulting physical behaviour parameters of the actuator, under different operating conditions (eg temperature, humidity, physical load type etc).

The switching elements are shown in FIGS. 4 to 6 variously as symbolic switches or as silicon-based MOSFET transistors. Depending on the particular application and implementation, the elements shown as switches may for example be implemented as MOSFETs or Gallium Nitride (GaN) transistors or Silicon Carbide (SiC) transistors if actively switched, or as diodes or diode-connected transistors if operating synchronously with other switched components. For example, the DC-DC converter 30 shown in FIG. 6 may be configured such that the downstream side rectification circuit comprises soft-switched transistors 34 and 35, while the upstream side rectification circuit (shown as transistors 36, 37, 38, 39) comprises simple diodes or diode-connected transistors. In this case, the upstream side rectification circuit follows the switching of the downstream side circuit synchronously, as a slave arrangement.

As described above, the DC-DC converter circuit 30 may advantageously operate synchronously, and preferably at a substantially constant operating (switching) frequency. The bidirectional converter circuit 28 may also be configured to operate at a substantially constant switching frequency. This frequency may be different from the operating frequency of the DC-DC converter circuit 30, or it may be selected to the same as the operating frequency of the DC-DC converter circuit 30. The latter variant has the advantage of reducing ripple in VP, and may mean that the capacitor 24 is not required at all, or only as a small component, since in this case energy can be transferred back and forth synchronously between the input capacitor 12 and load capacitor 1.

FIG. 6 shows an implementation of the input circuit 10 using a power factor correction (PFC) circuit to generate a constant supply voltage $V_S$ from a range of input voltages applied to input 16. Capacitor 12 at the output of the PFC (10) may advantageously be a large capacitor capable of storing a big charge which moves back and forth through the circuit during dynamic operation when the output voltage $V_C$ changes significantly. Such capacitors could for example include electrolytic or/and specialized foil capacitors. The input circuit 10 may be constructed using components with a much lower power rating than would be needed for delivering the total amount of power delivered to the load capacitance 1. The power rating of the input circuit 10 may for example be lower than 15% of the quantity $(C \times f \times U^2)$, where C is the load capacitance, f is the operating frequency of the converter circuit 20, and U is the maximum permitted voltage swing within one switching cycle of the converter circuit 20.

IMPLEMENTATION EXAMPLES

Generally, when used in the example application of a variable capacitor, the various operating parameters may be for example in the following ranges:

AC input voltage: 80V to 400 Vrms (compatible with any typical mains power outlet voltage worldwide)
$V_S$: 100V to 600V
$V_P$: 0V to $V_S$
Load capacitance: 5 nF or more; or 50 nF or more; or 500 nF or more In the case of a matching network for fast plasma ignition with a large voltage change at the process start, the operating parameters may be for example:
AC input voltage to 16: 90 to 265 Vrms
$V_S$: 425V DC
$V_P$: 0V to $V_S$
$V_C$: 0V to 5 kV or more
Control electrode capacitance charge/discharge time: less than 10 ms or less than 1 ms or less than 0.1 ms
Capacitor bias voltage difference: 0 to 2 kV or higher, or 0 to 4 kV or higher, or 0 to 6 kV or higher
Load capacitance: 5 nF or more; or 50 nF or more; or 500 nF or more In the case of a matching network optimized for RF power pulsing for a plasma chamber, the operating parameters may be for example:
AC input voltage to 16: 90 to 265 Vrms
$V_S$: 425V DC
$V_P$: 0V to $V_S$
$V_C$: 0V to 1 kV or more, or 3 kV or more, or 5 kV or more
Control electrode capacitance charge/discharge time: less than 10 ms or less than 1 ms or less than 0.1 ms or less than 0.01 ms
$V_C$ switching frequency: 1 kHz or higher, 10 kHz or higher, 100 kHz or higher
Periodic capacitor bias voltage difference between low and high RF power levels: 0 to 0.5 kV or higher, or 0 to 2 kV or higher, or 0 to 4 kV or higher
Load capacitance: 5 nF or more; or 50 nF or more; or 500 nF or more.

In the case of a fast piezo actuator, the operating parameters may be for example:
AC input voltage to 16: 90 to 265 Vrms
$V_S$: 425V DC
$V_P$: 0V to $V_S$
$V_C$: 0V to 1 kV or more
Control electrode capacitance charge/discharge time: less than 10 ms, or less than 1 ms, or less than 0.1 ms, or less than 0.01 ms
Actuator frequency: 100 Hz or higher, 1 kHz or higher, 10 kHz or higher, 100 kHz or higher.

The control voltage generator circuit of the invention has been described above with reference to two example applications of a capacitor 1 and a piezo actuator. However, these are just two examples of possible applications. The circuit can be used in other applications, in particular applications which require high efficiency (low net power consumption), high voltage, and high speed operation with a fast control response.

The invention claimed is:

1. A variable voltage generator circuit for generating an output voltage, $V_C$, which is variable in dependence on a voltage control input signal, for output to a substantially purely capacitive load, the variable voltage generator circuit comprising:
an input capacitor;
a bidirectional DC-DC converter circuit configured to convert a voltage $V_{Cin}$ on the input capacitor to the output voltage $V_C$ on a load capacitance or vice versa, the bidirectional DC-DC converter circuit having a voltage conversion factor G which is variable by varying the voltage control input signal,
wherein the bidirectional DC-DC converter circuit is operable, within a period of less than 10 ms, to:
when $G > V_C/V_{Cin}$, charge the load capacitance and discharge the input capacitor, such that substantially all of the electrical energy for the charging of the load capacitance is supplied by the discharging of the input capacitor, or,
when $G < V_C/V_{Cin}$, discharge the load capacitance and charge the input capacitor, such that substantially all of the electrical energy for the charging of the input capacitor is supplied by the discharging of the load capacitance,
wherein the bidirectional DC-DC converter circuit comprises a first bidirectional DC-DC converter having a variable voltage conversion factor (g) and a second bidirectional DC-DC converter having a fixed voltage conversion factor (K),
wherein the first bidirectional DC-DC converter comprises a bidirectional buck converter, and/or wherein the second bidirectional DC-DC converter comprises a bidirectional resonant LLC-converter, and
wherein the voltage control input signal is a pulse-width modulation signal applied to switching means of the bidirectional buck converter, the switching means being connected to provide, under control of a control unit, pulse-width modulated voltage conversion between the input capacitor voltage ($V_{Cin}$) and a further capacitor via a first inductor, such that a voltage ($V_P$) across the further capacitor is variable between substantially zero volts and substantially the input capacitor voltage ($V_{Cin}$) by varying the pulse-width ratio of the voltage control input signal.

2. The variable voltage generator circuit of claim 1, wherein said charging the load capacitance and discharging the input capacitor comprises charging the load capacitance and discharging the input capacitor until $G=V_C/V_{Cin}$, and said discharging the load capacitance and charging the input capacitor comprises discharging the load capacitance and charging the input capacitor until $G=V_C/V_{Cin}$.

3. The variable voltage generator circuit of claim 1, wherein the bidirectional resonant LLC-converter comprises an upstream side rectification circuit and a load side rectification circuit, wherein the upstream side and load side rectification circuits are arranged to operate synchronously.

4. The variable voltage generator circuit of claim 3, wherein one of the upstream side and load side rectification circuits comprises transistors arranged to be actively soft-switched by means of an LLC switching control signal, and wherein the other comprises diodes or diode-connected transistors connected in a slave rectification arrangement.

5. The variable voltage generator circuit of claim 1, wherein the bidirectional buck converter circuit comprises a plurality of bidirectional buck converter circuits configured for interleaved operation.

6. The variable voltage generator circuit of claim 1, wherein the first inductor and the further capacitor of the bidirectional buck converter have an LC time-constant of less than 10 ms.

7. The variable voltage generator circuit of claim 1, wherein the bidirectional resonant LLC-converter has a resonant frequency which is greater than 106 kHz.

8. The variable voltage generator circuit of claim 1, further comprising a top-up circuit configured to supply electrical energy to charge the input capacitor so as to compensate for losses in the bidirectional DC-DC converter circuit and in charging and discharging the load capacitance.

9. The variable voltage generator circuit of claim 8, wherein the top-up circuit comprises a power factor correction circuit configured for charging the input capacitor at a rate which compensates for losses in the bidirectional DC-DC converter circuit.

10. A variable power capacitor comprising:
a variable voltage generator circuit for generating an output voltage, $V_C$, which is variable in dependence on a voltage control input signal, for output to a substantially purely capacitive load, the variable voltage generator circuit comprising:
an input capacitor;
a bidirectional DC-DC converter circuit configured to convert a voltage $V_{Cin}$ on the input capacitor to the output voltage $V_C$ on a load capacitance or vice versa, the bidirectional DC-DC converter circuit having a voltage conversion factor G which is variable by varying the voltage control input signal,
wherein the bidirectional DC-DC converter circuit is operable, within a period of less than 10 ms, to:
when $G>V_C/V_{Cin}$, charge the load capacitance and discharge the input capacitor, such that substantially all of the electrical energy for the charging of the load capacitance is supplied by the discharging of the input capacitor, or,
when $G<V_C/V_{Cin}$, discharge the load capacitance and charge the input capacitor, such that substantially all of the electrical energy for the charging of the input capacitor is supplied by the discharging of the load capacitance,
wherein the bidirectional DC-DC converter circuit comprises a first bidirectional DC-DC converter having a variable voltage conversion factor (g) and a second bidirectional DC-DC converter having a fixed voltage conversion factor (K),
wherein the first bidirectional DC-DC converter comprises a bidirectional buck converter, and/or wherein the second bidirectional DC-DC converter comprises a bidirectional resonant LLC-converter, and
wherein the voltage control input signal is a pulse-width modulation signal applied to switching means of the bidirectional buck converter, the switching means being connected to provide, under control of a control unit, pulse-width modulated voltage conversion between the input capacitor voltage ($V_{Cin}$) and a further capacitor via a first inductor, such that a voltage ($V_P$) across the further capacitor is variable between substantially zero volts and substantially the input capacitor voltage ($V_{Cin}$) by varying the pulse-width ratio of the voltage control input signal;
a dielectric; and
control electrodes for applying a permittivity control voltage ($V_C$) across at least part of the dielectric, wherein the variable voltage generator circuit is connected to the control electrodes.

11. A method of varying an output voltage $V_C$ applied to a substantially purely capacitive load, such that the net amount of electrical energy supplied to the load is substantially zero, the method comprising:
providing a variable voltage generator circuit for generating the output voltage $V_C$ which is variable in dependence on a voltage control input signal, the variable voltage generator circuit comprising:
an input capacitor; and
a bidirectional DC-DC converter circuit, the bidirectional DC-DC converter circuit having a voltage conversion factor G which is variable by varying the voltage control input signal;
varying the voltage conversion factor G of the bidirectional DC-DC converter circuit connected between the input capacitor and a load capacitance so as to convert a voltage $V_{Cin}$ on the input capacitor to the output voltage $V_C$ on the load capacitance or vice versa;
when $G>V_C/V_{Cin}$, operating the bidirectional DC-DC converter circuit to, within less than 10 ms, charge the load capacitance and discharge the input capacitor such that substantially all of the electrical energy for the charging of the load capacitance is supplied by the discharging of the input capacitor;
when $G<V_C/V_{Cin}$, operating the bidirectional DC-DC converter circuit to, within less than 10 ms, charge the input capacitor and discharge the load capacitance, such that substantially all of the electrical energy for the charging of the input capacitor is supplied by the discharging of the load capacitance,
wherein the bidirectional DC-DC converter circuit comprises a first bidirectional DC-DC converter having a variable voltage conversion factor (g) and a second bidirectional DC-DC converter having a fixed voltage conversion factor (K),
wherein the first bidirectional DC-DC converter comprises a bidirectional buck converter, and/or wherein the second bidirectional DC-DC converter comprises a bidirectional resonant LLC-converter, and
wherein the voltage control input signal is a pulse-width modulation signal applied to switching means of the bidirectional buck converter, the switching means being connected to provide, under control of a control unit, pulse-width modulated voltage conversion between the input capacitor voltage ($V_{Cin}$) and a further capacitor via a first inductor, such that a voltage ($V_P$) across the further capacitor is variable between substantially zero volts and substantially the input capacitor voltage ($V_{Cin}$) by varying the pulse-width ratio of the voltage control input signal.

12. The method of claim 11, wherein a variable power capacitor comprises a dielectric and control electrodes for applying a permittivity control voltage ($V_C$) across at least part of the dielectric, and wherein the variable power capacitor comprises the variable voltage generator circuit connected to the control electrodes, the method further comprising controlling a capacitance of the variable power capacitor by varying the permittivity control voltage ($V_C$).

13. The method of claim 12, wherein the varying of the permittivity control voltage ($V_C$) comprises varying a pulse-width ratio of a control signal so as to control a conversion factor of the bidirectional buck converter.

14. The method of claim 11, the method comprising operating the variable voltage generator circuit with:
- an AC supply voltage in the range 90V rms to 365V rms;
- a DC supply voltage ($V_S$) in the range 100V to 600V;
- a permittivity control voltage ($V_C$) range of at least 1 kV; and
- a charging/discharging time of the load capacitance of less than 10 ms.

* * * * *